(12) United States Patent
Li et al.

(10) Patent No.: US 11,199,562 B2
(45) Date of Patent: Dec. 14, 2021

(54) WAFER TESTING SYSTEM INCLUDING A WAFER-FLATTENING MULTI-ZONE VACUUM CHUCK AND METHOD FOR OPERATING THE SAME

(71) Applicant: WESTERN DIGITAL TECHNOLOGIES, INC., San Jose, CA (US)

(72) Inventors: Liang Li, Shanghai (CN); Chao Xu, Shanghai (CN)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 203 days.

(21) Appl. No.: 16/535,505

(22) Filed: Aug. 8, 2019

(65) Prior Publication Data
US 2021/0041478 A1    Feb. 11, 2021

(51) Int. Cl.
| | | |
|---|---|---|
| *G01R 1/04* | (2006.01) | |
| *H01L 21/67* | (2006.01) | |
| *G01R 31/28* | (2006.01) | |
| *H01L 21/683* | (2006.01) | |
| *H01L 27/11582* | (2017.01) | |
| *H01L 27/11556* | (2017.01) | |

(52) U.S. Cl.
CPC ........ *G01R 1/0408* (2013.01); *G01R 31/2831* (2013.01); *H01L 21/67288* (2013.01); *H01L 21/6838* (2013.01); *H01L 27/11556* (2013.01); *H01L 27/11582* (2013.01)

(58) Field of Classification Search
CPC ............... G01R 1/073; G01R 1/07314; G01R 1/07328; G01R 31/2893
See application file for complete search history.

(56) References Cited

U.S. PATENT DOCUMENTS

| | | |
|---|---|---|
| 3,940,211 A | 2/1976 | Johannsmeier |
| 4,040,736 A | 8/1977 | Johannsmeier |
| 4,436,985 A | 3/1984 | Weber |
| 4,508,435 A | 4/1985 | Graham et al. |
| 4,553,917 A | 11/1985 | Lee |
| 4,680,061 A | 7/1987 | Lamont, Jr. et al. |
| 4,745,484 A | 5/1988 | Drexler et al. |
| 4,766,788 A | 8/1988 | Yashiki et al. |
| 4,795,518 A | 1/1989 | Meinel et al. |
| 4,842,578 A | 6/1989 | Johnson et al. |
| 5,230,741 A | 7/1993 | Van De Ven et al. |
| 5,238,499 A | 8/1993 | Van De Ven et al. |
| 5,374,594 A | 12/1994 | Van De Ven et al. |
| 5,511,608 A | 4/1996 | Boyd |
| 5,529,626 A | 6/1996 | Stewart |

(Continued)

OTHER PUBLICATIONS

U.S. Appl. No. 16/371,290, filed Apr. 1, 2019, SanDisk Technologies LLC.

*Primary Examiner* — Tung X Nguyen
(74) *Attorney, Agent, or Firm* — The Marbury Law Group PLLC

(57) ABSTRACT

A wafer testing system and a method of testing a wafer include placing a wafer on a vacuum chuck containing a plurality of vacuum zones, determining a warpage of the wafer, providing a different magnitude of vacuum suction to different vacuum zones at the same time based on the determined warpage of the wafer to reduce the warpage of the wafer, and testing the wafer.

18 Claims, 12 Drawing Sheets

(56) References Cited

U.S. PATENT DOCUMENTS

| | | | |
|---|---|---|---|
| 5,564,682 A * | 10/1996 | Tsuji | B25B 11/005 269/21 |
| 5,584,746 A | 12/1996 | Tanaka et al. | |
| 5,936,829 A | 8/1999 | Moslehi | |
| 5,993,547 A | 11/1999 | Sato | |
| 6,025,099 A | 2/2000 | Slonaker | |
| 6,182,957 B1 | 2/2001 | Becker | |
| 6,271,676 B1 | 8/2001 | Montoya | |
| 6,386,962 B1 | 5/2002 | Gotkis et al. | |
| 6,427,991 B1 | 8/2002 | Kao | |
| 6,441,606 B1 | 8/2002 | Caldwell et al. | |
| 6,811,370 B2 | 11/2004 | Buermann | |
| 6,907,924 B2 | 6/2005 | Moslehi | |
| 7,021,635 B2 | 4/2006 | Sheydayi et al. | |
| 7,050,141 B2 | 5/2006 | Yokoue | |
| 7,270,724 B2 | 9/2007 | Elliott et al. | |
| 7,303,643 B2 | 12/2007 | Jeromin et al. | |
| 7,344,808 B2 | 3/2008 | Numanami et al. | |
| 7,790,231 B2 | 9/2010 | McCutcheon et al. | |
| 8,220,228 B2 | 7/2012 | Itoh | |
| 8,580,078 B2 | 11/2013 | Bailey, III et al. | |
| 8,695,990 B2 | 4/2014 | Vodanovic et al. | |
| 8,721,908 B2 | 5/2014 | Bailey, III et al. | |
| 9,102,005 B2 | 8/2015 | Muramatsu et al. | |
| 9,209,062 B1 | 12/2015 | Kukas | |
| 9,324,598 B2 | 4/2016 | Pederson et al. | |
| 9,343,358 B1 | 5/2016 | Xu | |
| 9,419,135 B2 | 8/2016 | Baenninger et al. | |
| 9,455,267 B2 | 9/2016 | Zhang et al. | |
| 9,698,223 B2 | 7/2017 | Sharangpani et al. | |
| 9,799,671 B2 | 10/2017 | Pachamuthu et al. | |
| 9,808,841 B2 | 11/2017 | Kobayashi et al. | |
| 9,875,922 B2 | 1/2018 | Pederson et al. | |
| 9,887,207 B2 | 2/2018 | Zhang et al. | |
| 9,917,093 B2 | 3/2018 | Chu et al. | |
| 10,103,161 B2 | 10/2018 | Ito et al. | |
| 10,176,972 B2 | 1/2019 | Watanabe et al. | |
| 10,355,012 B2 | 7/2019 | Shimabukuro et al. | |
| 2001/0000721 A1 | 5/2001 | Buermann | |
| 2001/0002584 A1 | 6/2001 | Liu et al. | |
| 2001/0017109 A1 | 8/2001 | Liu et al. | |
| 2002/0026862 A1 | 3/2002 | Naviysky et al. | |
| 2002/0069966 A1 | 6/2002 | Elliott et al. | |
| 2003/0029610 A1 | 2/2003 | Moslehi | |
| 2004/0145698 A1 | 7/2004 | Yokoue | |
| 2004/0154647 A1 | 8/2004 | Sheydayi et al. | |
| 2004/0157420 A1 | 8/2004 | Sheydayi | |
| 2005/0020083 A1 | 1/2005 | Numanami et al. | |
| 2005/0056963 A1 | 3/2005 | McCutcheon | |
| 2005/0115669 A1 | 6/2005 | Jeromin et al. | |
| 2006/0103830 A1 | 5/2006 | Holmes et al. | |
| 2007/0105384 A1 | 5/2007 | McCutcheon et al. | |
| 2008/0179010 A1 | 7/2008 | Bailey, III et al. | |
| 2008/0276758 A1 | 11/2008 | Itoh | |
| 2009/0008373 A1 | 1/2009 | Muramatsu et al. | |
| 2009/0057376 A1 | 3/2009 | Hoover et al. | |
| 2009/0120368 A1 | 5/2009 | Lubomirsky et al. | |
| 2011/0241298 A1 | 10/2011 | Vodanovic et al. | |
| 2012/0328797 A1 | 12/2012 | Maass et al. | |
| 2013/0115764 A1 | 5/2013 | Pederson et al. | |
| 2014/0203837 A1 * | 7/2014 | Minemier | G01R 31/2851 324/762.03 |
| 2014/0326278 A1 | 11/2014 | Kobayashi et al. | |
| 2015/0343484 A1 | 12/2015 | Kukas | |
| 2016/0233122 A1 | 8/2016 | Pederson et al. | |
| 2016/0343544 A1 | 11/2016 | Watanabe et al. | |
| 2017/0053822 A1 | 2/2017 | Ben Natan et al. | |
| 2017/0330783 A1 | 11/2017 | Torii | |
| 2018/0122681 A1 | 5/2018 | Ellis et al. | |
| 2018/0226285 A1 | 8/2018 | Hanamachi et al. | |
| 2018/0284071 A1 | 10/2018 | Wright | |
| 2019/0096848 A1 | 3/2019 | Huang et al. | |
| 2019/0311960 A1 * | 10/2019 | Tan | H01L 22/34 |

* cited by examiner

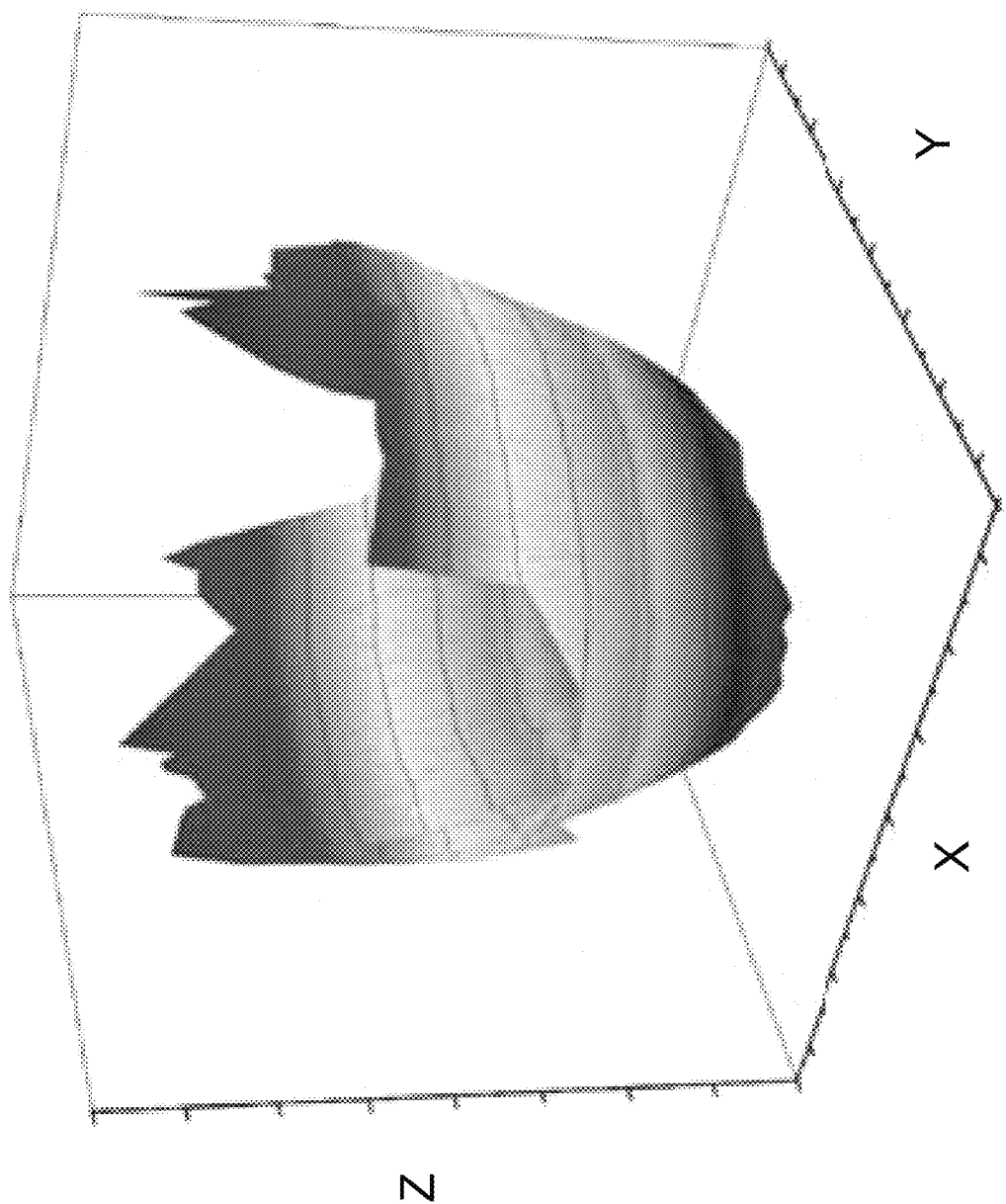

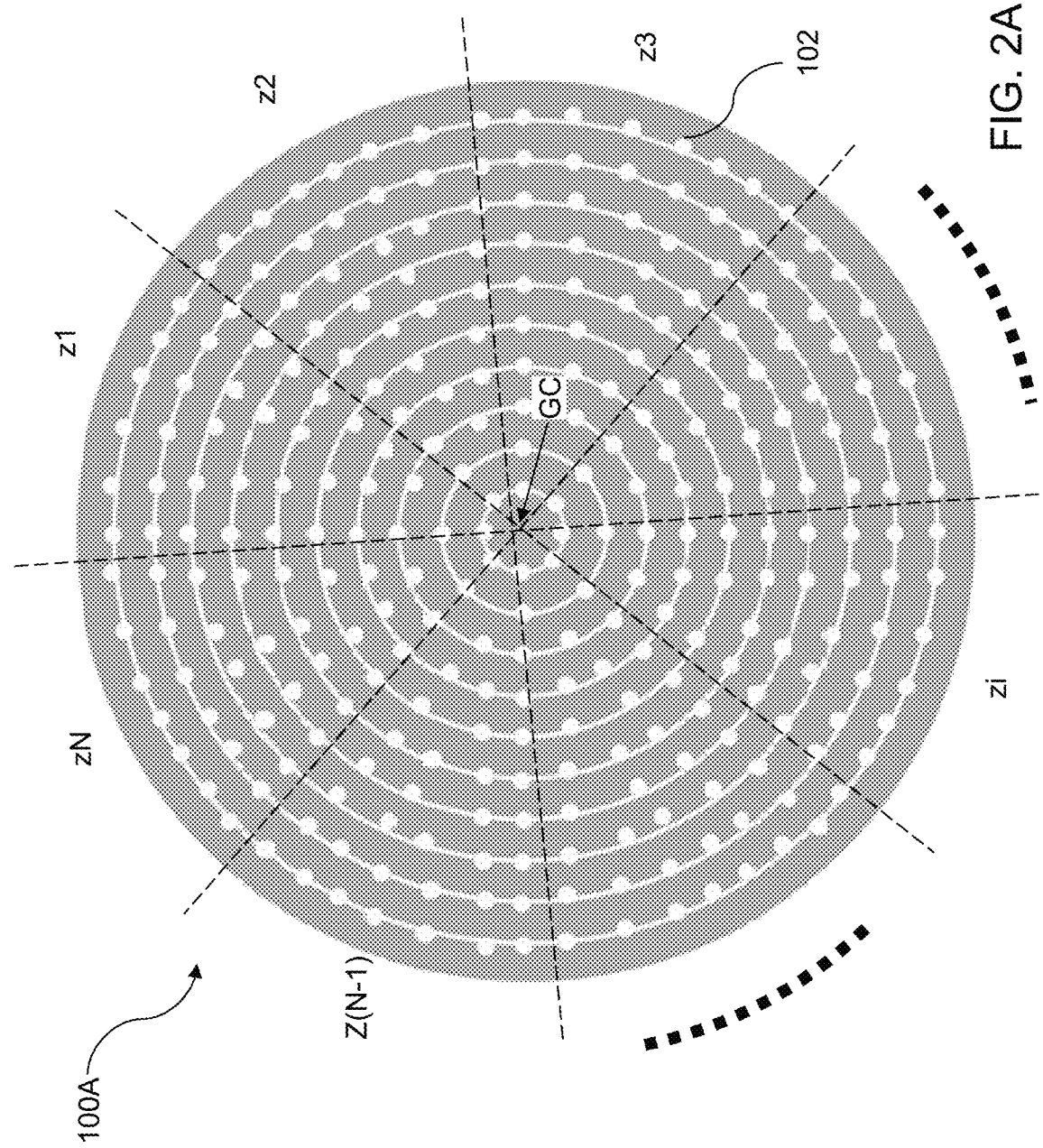

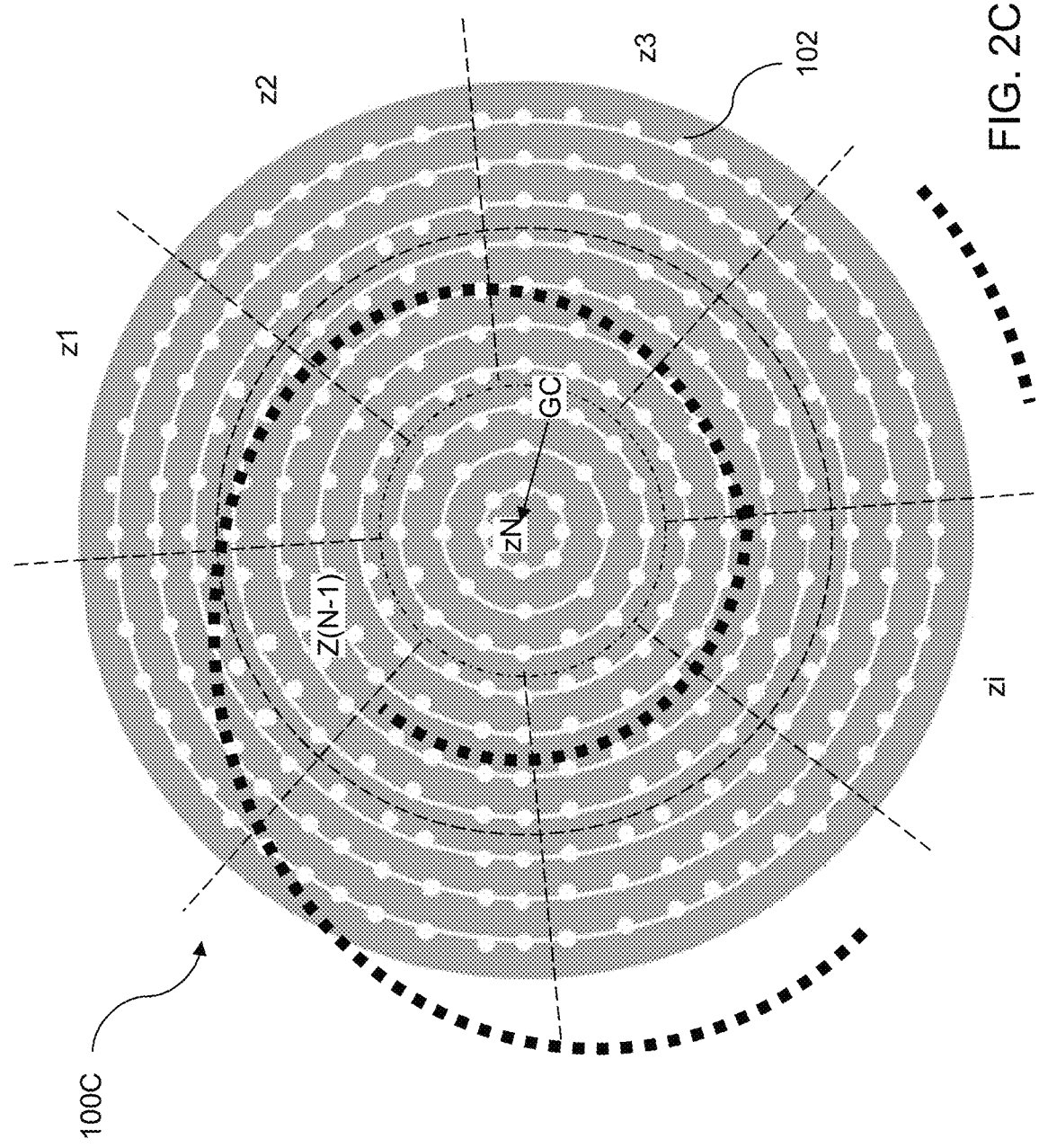

WAFER TESTING SYSTEM INCLUDING A WAFER-FLATTENING MULTI-ZONE VACUUM CHUCK AND METHOD FOR OPERATING THE SAME

FIELD

The present disclosure relates generally to the field of semiconductor testing apparatus, and particularly to a wafer testing system including a wafer-flattening multi-zone vacuum chuck and method for operating the same.

BACKGROUND

Semiconductor devices may be electrically tested after fabrication. Electrical testing may be performed in a wafer testing system prior to dicing the wafer into semiconductor die. The wafer testing system typically includes a chuck which supports the wafer during testing.

SUMMARY

According to an aspect of the present disclosure, an apparatus comprises a vacuum chuck configured to hold a wafer and comprising a plurality of vacuum zones, each vacuum zone including respective vacuum suction ports, and vacuum control instrumentation configured to individually control a magnitude of vacuum suction for each of the vacuum zones to provide a different magnitude of vacuum suction to different vacuum zones at the same time based on warpage of the wafer.

According to another aspect of the present disclosure, a method of testing a wafer includes placing a wafer on a vacuum chuck containing a plurality of vacuum zones, determining a warpage of the wafer, providing a different magnitude of vacuum suction to different vacuum zones at the same time based on the determined warpage of the wafer to reduce the warpage of the wafer, and testing the wafer.

BRIEF DESCRIPTION OF THE DRAWINGS

FIG. 1D is a three-dimensional graph illustrating warpage of a first exemplary wafer including three-dimensional memory dies containing the exemplary three-dimensional memory devices.

FIG. 2A is a top-down view of a first exemplary vacuum chuck according to an embodiment of the present disclosure.

FIG. 2C is a top-down view of a third exemplary vacuum chuck according to an embodiment of the present disclosure.

DETAILED DESCRIPTION

Figure 1A:
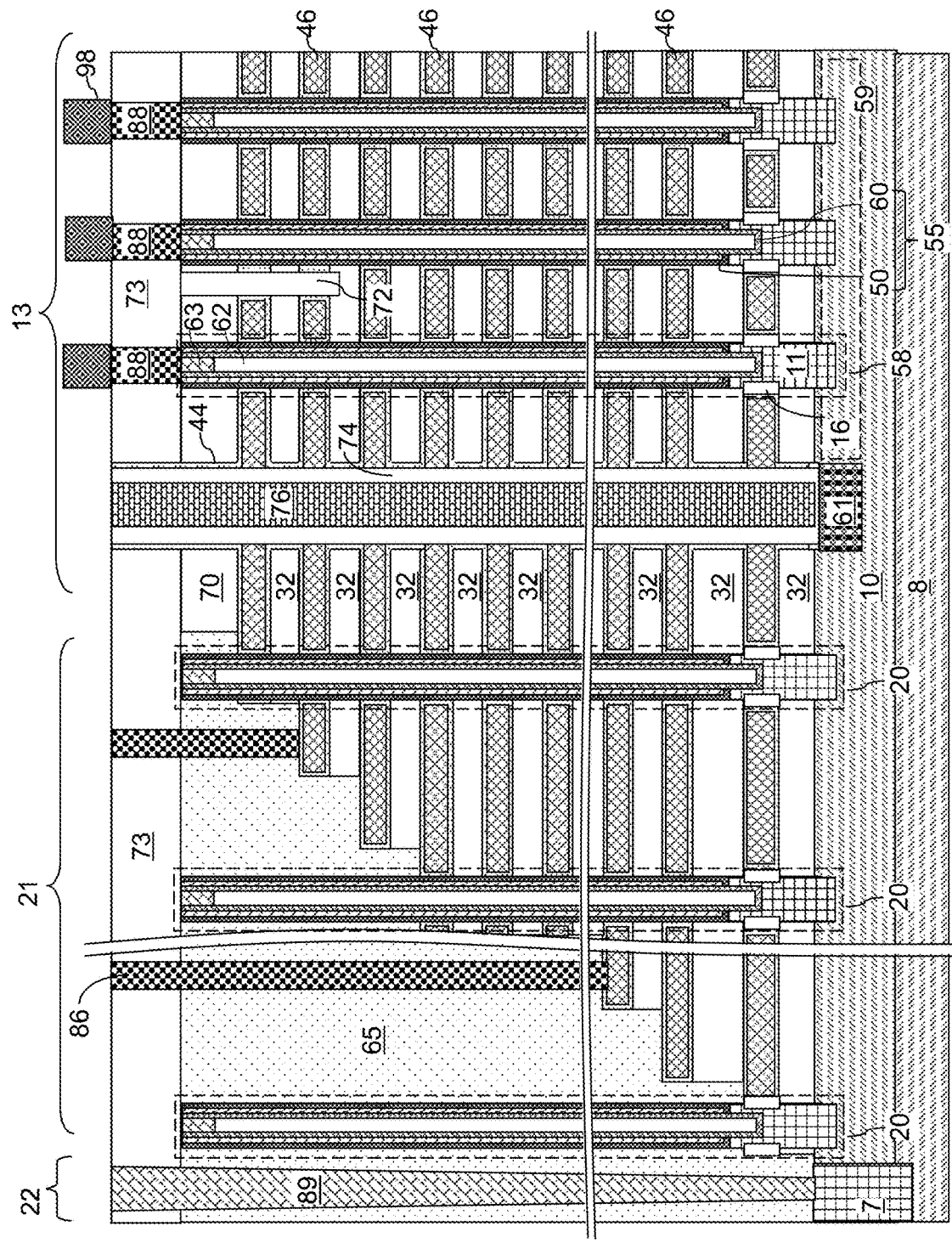
FIG. 1A is a schematic vertical cross-sectional view of an exemplary three-dimensional memory device according to an embodiment of the present disclosure.

As discussed above, the present disclosure is directed to an apparatus, such as a wafer testing system, including a wafer-flattening multi-zone vacuum chuck and methods for operating the same, the various aspects of which are described herebelow in detail.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. Unless otherwise indicated, a "contact" between elements refers to a direct contact between elements that provides an edge or a surface shared by the elements. As used herein, a first element located "on" a second element may be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and may be fabricated employing the various embodiments described herein.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded thereamongst, for example, by flip-chip bonding or another chip-to-chip bonding. A package or a chip may include a single semiconductor die (or a "die") or a plurality of semiconductor dies. A die is the smallest unit that can independently execute external commands or report status. Typically, a package or a chip with multiple dies is capable of simultaneously executing as many number of external commands as the total number of dies therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. Each plane contains a number of memory blocks (or "blocks"), which are the smallest unit that may be erased by in a single erase operation. Each memory block contains a number of pages, which are the smallest units that may be selected for programming.

Figure 1B:
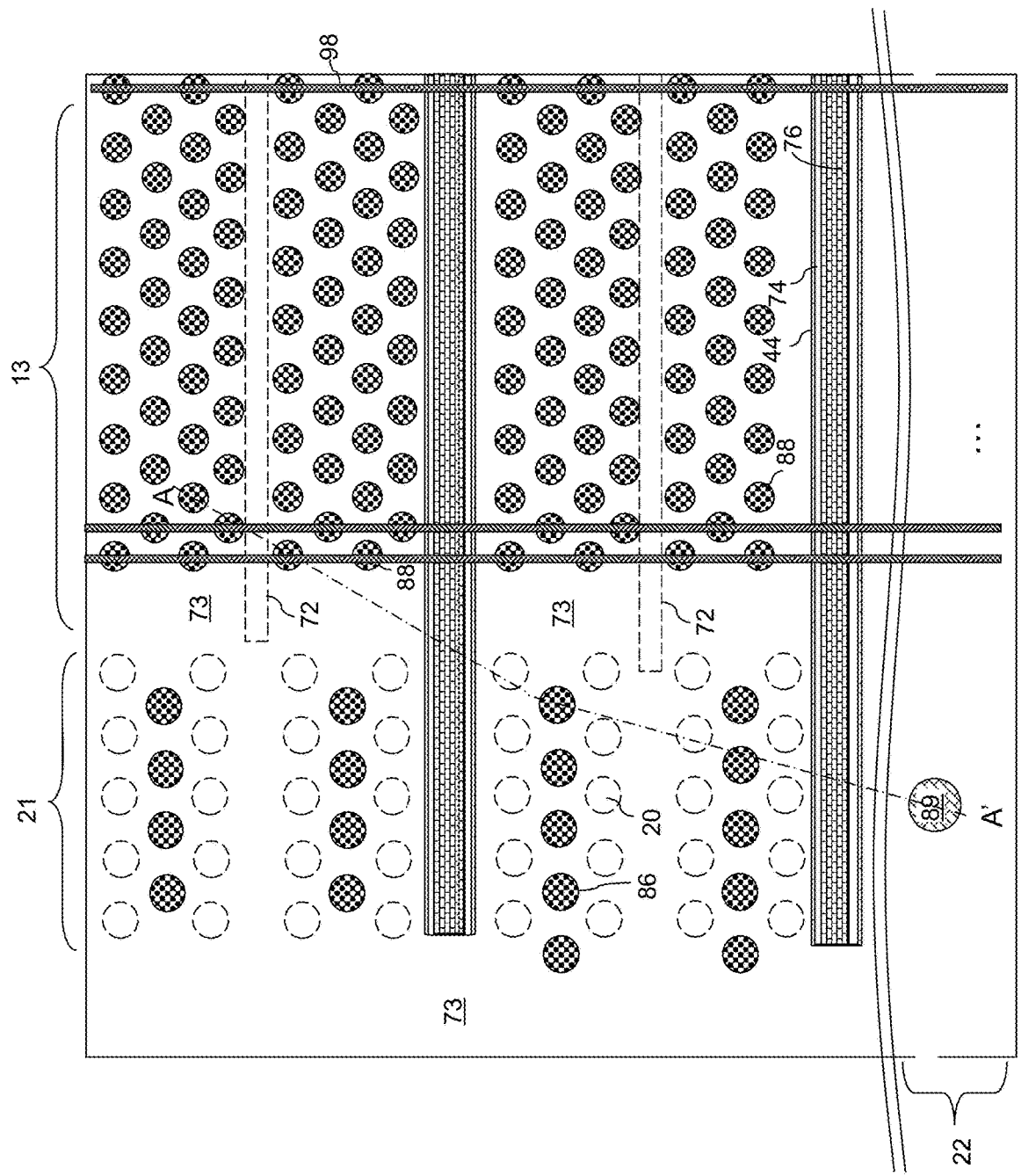
FIG. 1B is a top-down view of the exemplary three-dimensional memory device of FIG. 1A.

A non-limiting example of a solid state device that may be tested using the chuck of the embodiments of the present disclosure is illustrated in FIGS. 1A and 1B. While a three-dimensional NAND memory device is illustrated in FIGS. 1A and 1B, the devices that may be tested using the chuck of the embodiments of the present disclosure include any other memory devices, such as two-dimensional NAND memory devices, NOR memory devices, SRAM's, DRAM's, ReRAM memory devices, or spin torque memory devices, logic devices, such as a processor devices, sensor devices, etc.

The three-dimensional NAND memory device illustrated in FIGS. 1A and 1B includes a substrate (8, 10), which may be a semiconductor substrate. The substrate (8, 10) can include a wafer 8 such as a semiconductor wafer, for example a silicon wafer, and an optional semiconductor material layer 10 that is formed on the wafer 8. Semiconductor devices 7 such as field effect transistors may be formed on the semiconductor substrate to provide a peripheral circuit (e.g., driver circuit) for controlling operation of the three-dimensional memory devices provided in the memory array region (e.g., memory plane) 110. The peripheral circuit can include a sense amplifier circuitry electrically connected to bit lines 98 that laterally extend into the memory array region 110. The region of the semiconductor devices 7 is referred to as a peripheral device region 22. Alternatively, the semiconductor devices 7 of the peripheral circuit may be formed on a separate substrate (e.g., separate silicon wafer) and then bonded to the memory die containing the memory array region 110. An alternating stack of insulating layers 32 and spacer material layers are formed over the substrate (8, 10). The spacer material layers are formed as, or are subsequently replaced with, electrically conductive layers 46. An insulating cap layer 70 may be formed over the alternating stack (32, 46). The middle electrically conductive layers 46 comprise word lines/control gate electrodes of the NAND memory devices. At least one upper and lower electrically conductive layer 46 comprises a respective drain and source select gate electrode.

A staircase region may be formed in the contact region 21 by patterning the alternating stack (32, 46) such that underlying layers extend farther than overlying layers. A retro-stepped dielectric material portion 65 may be formed over the stepped surfaces of the alternating stack (32, 46) in the staircase region. Memory holes (i.e., memory openings) may be formed in the memory array region 110 and support openings may be formed in the contact region 21 by an anisotropic etch employing an etch mask layer. Memory opening fill structures 58 may be formed in each memory opening, and support pillar structures 20 may be formed in each support opening. The memory opening fill structures 58 and the support pillar structures 20 can include a same set of structural elements have a same composition. For example, each of the memory opening fill structures 58 and the support pillar structures 20 can include a pedestal channel portion 11, a memory stack structure 55, an optional dielectric core 62, and a drain region 63. Each memory stack structure 55 can include a memory film 50 and a semiconductor channel 60. Each memory film 50 can include a layer stack of, from outside to inside, an optional blocking dielectric layer, a vertical stack of memory elements (which may comprise, for example, as portions of a silicon nitride charge storage material layer or floating gates located at levels of the electrically conductive layers 46), and a tunneling dielectric layer. Each semiconductor channel 60 can include one semiconductor channel layer or a combination of a first and semiconductor channel layers.

A contact level dielectric layer 73 may be formed over the alternating stack (32, 46). If the spacer material layers are provided as sacrificial material layers, backside trenches may be formed between groups of memory opening fill structures 58 to facilitate replacement of the sacrificial material layers with electrically conductive layers 46. Backside recesses may be formed by introducing into the backside trenches an isotropic etchant that etches the material of the sacrificial material layers (e.g., silicon nitride or polysilicon layers) selective to the insulating layers 32 (e.g., silicon oxide layers), the memory opening fill structures 58, and the support pillar structures 20. Removal of the sacrificial material layers forms backside recesses that laterally surround the memory opening fill structures 58 and the support pillar structures 20. Tubular insulating spacers 16 may be formed around the pedestal channel portions 11, for example, by oxidation of the semiconductor material of the pedestal channel portions 11. Optional backside blocking dielectric layers 44 and the electrically conductive layers 46 may be formed in the backside recesses.

Source regions 61 may be formed in the semiconductor material layer 10 underneath the backside trenches, for example, by ion implantation. Surface regions of the semiconductor material layer 10 between the pedestal channel portions 11 and the source regions 61 constitute horizontal semiconductor channels 59. Insulating spacers 74 and backside contact via structures 76 (e.g., source electrode or source local interconnect) may be formed in the backside trenches. Additional contact via structures (88, 86, 89) may be formed through the contact level dielectric layer 73, and optionally through the retro-stepped dielectric material portion 65. For example, drain contact via structures 88 may be formed through the contact level dielectric layer 73 on each drain region 63. Word line contact via structures 86 may be formed on the electrically conductive layers 46 through the contact level dielectric layer 73 and the retro-stepped dielectric material portion 65 in the contact region 21 (e.g., in the word line electrically hook up region). Peripheral device contact via structures 89 may be formed through the contact level dielectric layer 73 and the retro-stepped dielectric material portion 65 in the peripheral device region 22 in electrical contact with respective nodes (e.g., sources, drains and/or gate electrodes) of the peripheral devices 7. An additional interconnect level dielectric material layer (not shown) and additional metal interconnect structures (not shown) may be formed. The bit lines 98 are located in the additional interconnect level dielectric material layer, extend in the bit line direction (e.g., x-direction) and electrically contact the drain contact via structures 88. The electrically conductive layers (e.g., word lines) 46 extend in the perpendicular word line direction (e.g., y-direction).

Figure 1C:
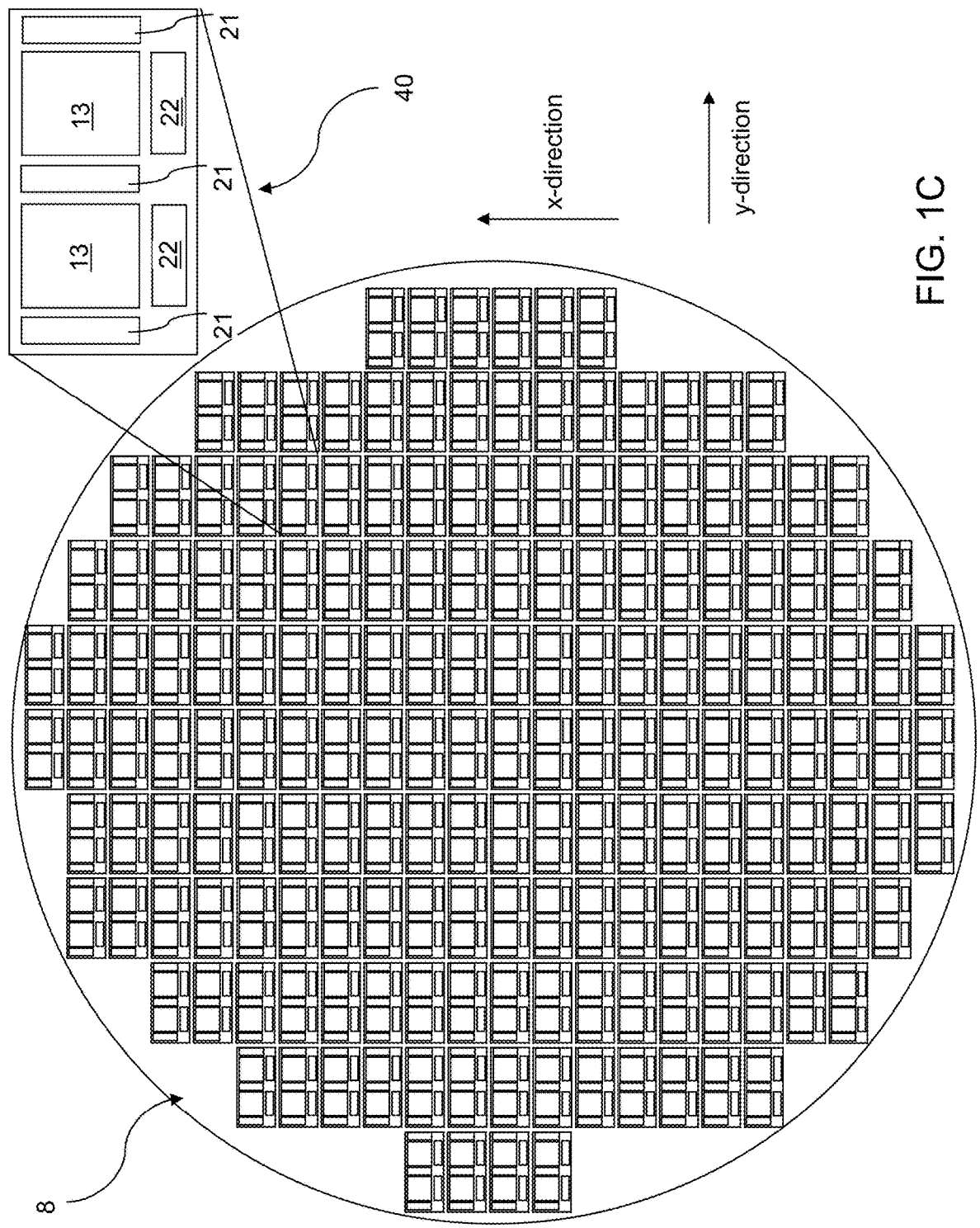
FIG. 1C is a top-down view of a wafer with a first exemplary array of in-process semiconductor dies.

Referring to FIG. 1C, multiple instances of a semiconductor device, such as multiple instances of the three-dimensional memory device illustrated in FIGS. 1A and 1B, may be provided within a plurality of semiconductor dies 40 arranged in an array of columns and rows extending along the respective x and y directions on the wafer 8. Various processing steps including deposition processes, lithographic patterning processes, and etch processes may be repeatedly performed to form the multiple instances of the three-dimensional memory device of FIGS. 1A and 1B.

In one embodiment, each semiconductor die 40 can include one or more of the memory array regions (e.g., memory planes) 13 illustrated in FIGS. 1A and 1B, one or more of the contact regions 21 containing word line driver circuits, such as word line decoders, and one or more optional peripheral device regions 22 containing the semiconductor devices 7, such as bit line driver circuits, such as sense amplifiers, etc., illustrated in FIGS. 1A and 1B. Alternatively, the peripheral device regions 22 may be formed on a separate wafer and then bonded to the wafer 8 over the memory array regions 13 and/or the contact regions 21.

Figure 1E:
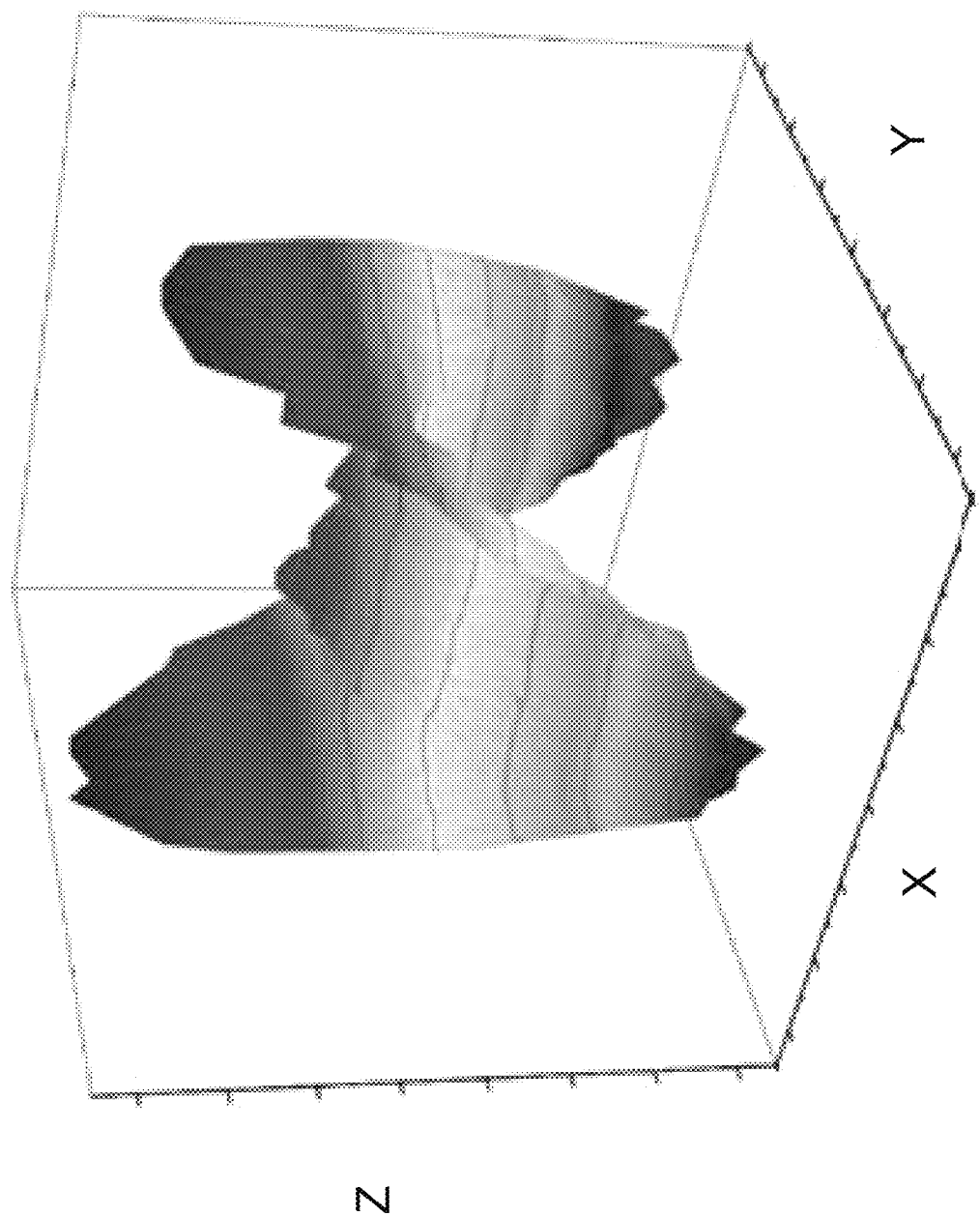
FIG. 1E is a three-dimensional graph illustrating warpage of a second exemplary wafer including three-dimensional memory dies

Thus, the above described three-dimensional memory devices, such as vertical NAND devices, include a stack of word lines 46 spaced apart from each other by insulating layers 32. Memory stack structures 55 vertically extend through each layer within the stack. The word lines 46 generate significant stress at a wafer level, and can distort the wafer 8 with various patterns. FIGS. 1D and 1E illustrate examples of respective U-shaped and saddle-shaped patterns of wafer 8 distortion. Wafer warpage impacts not only packaging and assembly processes but also wafer testing processes. During testing, wafer warpage can reduce stability and reliability of wafer testing due to unreliable contacts between a probe and test pads. While a wafer under test typically remains stable on a tester chuck due to vacuum suction provided to areas of the wafer that contacts the tester chuck, a significant portion or even a predominant portion of the wafer may be warped enough to remain detached from the tester chuck during testing, and thus, remain structurally unstable or remain incapable of providing reliable electrical contact between the probe and the test pads. Thus, a wafer testing system of various embodiments of the present disclosure includes a wafer-flattening multi-zone vacuum chuck, which increases the flatness of the wafer 8 under test and thus reduces or eliminates the negative effect of the wafer 8 warpage on the testing process.

Figure 2B:
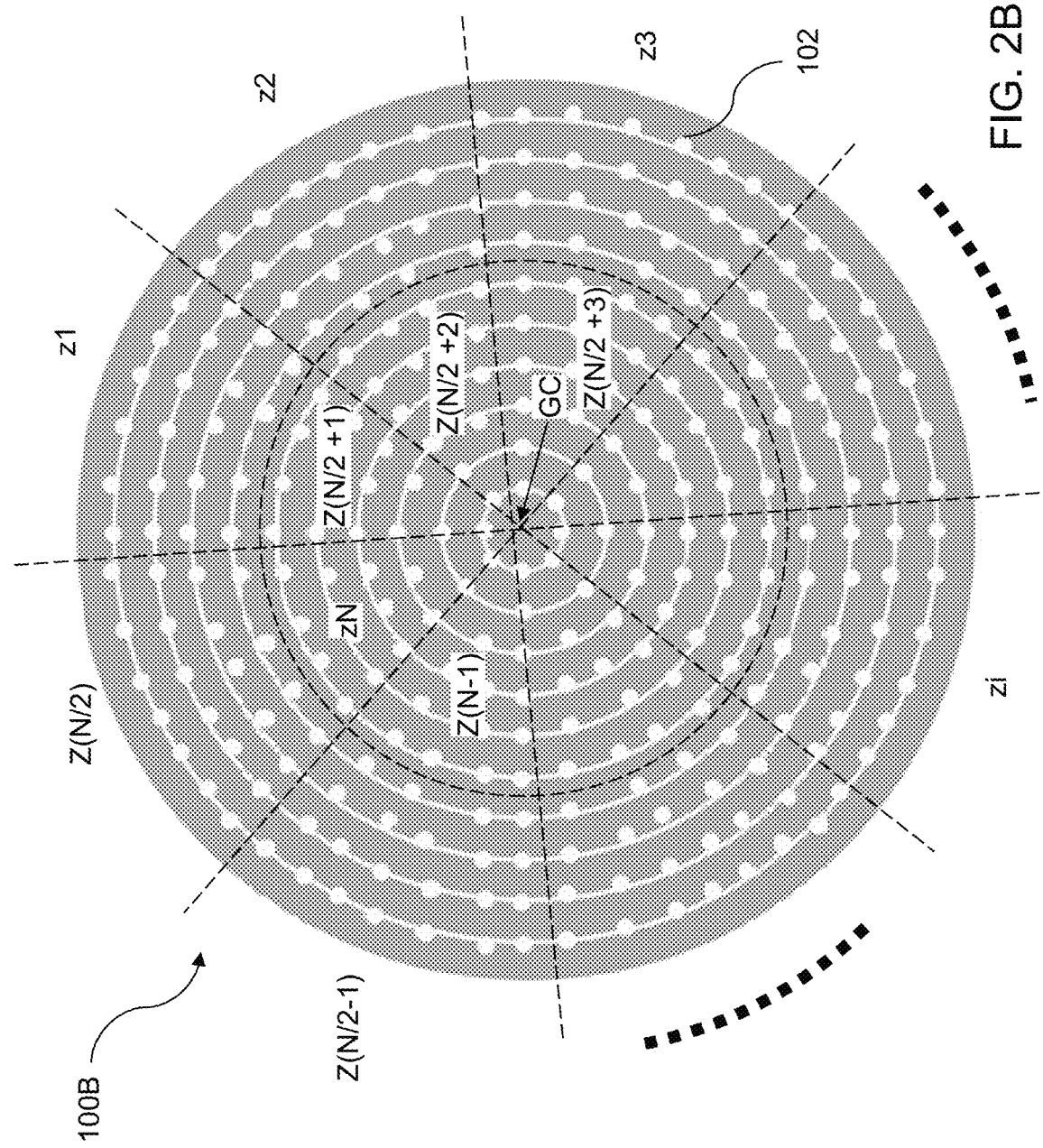
FIG. 2B is a top-down view of a second exemplary vacuum chuck according to an embodiment of the present disclosure.

Referring to FIGS. 2A-2C, exemplary vacuum chucks 100 according to embodiments of the present disclosure are illustrated. FIGS. 2A, 2B, and 2C illustrate a first exemplary vacuum chuck 100A, a second exemplary vacuum chuck 100A, and a third exemplary vacuum chuck 100A of the present disclosure, respectively.

Each vacuum chuck 100 of various embodiments of the present disclosure is configured to hold a substrate, such as a wafer on a top planar surface thereof. For example, the wafer may be a commercially available silicon wafer having a diameter of 100 mm, 125 mm, 150 mm, 200 mm, 300 mm, or 450 mm, any commercially available compound semiconductor wafer, or another substrate (e.g., conductive substrate, insulating substrate, etc).

According to an aspect of the present disclosure, the vacuum chuck 100 is configured to apply different vacuum suction per unit area across different areas of the front side surface of the vacuum chuck 100. As used herein, "vacuum suction" refers to the difference between atmospheric pressure and the pressure at the location of pressure measurement. In one embodiment, the vacuum chuck 100 comprises multiple vacuum zones zi (e.g., z1-zN) including respective vacuum suction ports 102. Each of the vacuum suction ports 102 is connected to a respective one of independently controlled vacuum pumping lines. Each of the independently controlled vacuum pumping lines may be connected to one or more of the vacuum suction ports 102. In one embodiment, each vacuum zone zi can include a respective set of plural vacuum suction ports 102 that is connected to a respective one of the independently controlled vacuum pumping lines. One independently controlled vacuum pumping line may be connected to one set of vacuum suction ports 102.

In one embodiment, two or more of the multiple vacuum zones zi are located at different azimuthal angle ranges around a vertical axis passing through a geometrical center GC of the vacuum chuck 100.

In the first configuration illustrated in FIG. 2A, each of the multiple vacuum zones zi can have a respective unique azimuthal angle range that does not overlap with azimuthal angle ranges of other vacuum zones zi (e.g., z1-zN) where N is an integer that ranges from 2 to 100, such as 4 to 32, for example 8 to 20). In this case, each of the multiple vacuum zones zi, where i is an integer from 1 to N (i.e., the vacuum zones range from z1 to zN) can have a general shape of a circular sector bounded by two straight lines having the length of the radius of the vacuum chuck 100A and an arc that spans an azimuthal range of 360 degrees divided by N, in which N is the total number of vacuum zones (z1-zN).

In the second configuration illustrated in FIG. 2B, the multiple vacuum zones (z1-zN) can include multiple subsets of vacuum zones (z1-zN) having different radial distance ranges from the vertical axis passing through the geometrical center GC of the vacuum chuck 100B. For example, a first subset (z1-z(N/2)) of the multiple vacuum zones (z1-zN) can radially extend from the outer periphery of the vacuum chuck 100B to a radial zone-boundary distance (which may be in a range from 30% to 80% of the radius of the vacuum chuck 100B), and a second subset (z(N/2+1)-zN) of the multiple vacuum zones (z1-zN) can radially extend from the radial zone-boundary distance to the geometrical center GC of the vacuum chuck 100B. With each subset of the vacuum zones (z1-zN), each vacuum zone can have a respective unique azimuthal angle range that does not overlap with azimuthal angle ranges of other vacuum zones (z1-zN).

Generally, two or more subsets of vacuum zones (z1-zN) having different radial distance ranges from the vertical axis passing through the geometrical center GC of the vacuum chuck 100 may be provided. The number of vacuum zones within each radial distance range may be the same, or different, among the multiple radial distance ranges.

In the third configuration illustrated in FIG. 2C, a single vacuum zone such as the N-th vacuum zone zN may be provided for the radial distance range including the geometrical center GC of the vacuum chuck 100C, i.e., for the innermost radial distance range.

The total number N of the vacuum zones (z1-zN) may be in a range from 2 to 100, such as from 4 to 32, although a greater number N can also be employed. Each vacuum zone may include 1 to 100, such as 2 to 50, for example 10 to 36 vacuum suction ports 102, although a greater number can also be employed. The independently controlled vacuum suction ports 102 can provide different magnitude of vacuum suction per unit area across the different areas of the vacuum chuck 100 to flatten a loaded substrate, such as a wafer, thereupon. Specifically, when a wafer with a non-uniform backside surface is located onto the vacuum chuck 100, greater vacuum suction per area may be provided in regions in which the backside of the wafer has a greater distance from the top surface of the vacuum chuck 100 and lesser vacuum suction per area may be provided in regions in which the backside of the wafer has a lesser distance from, or contacts, the top surface of the vacuum chuck 100. Thus, warpage of the loaded wafer may be reduced through the differential vacuum suction provided by the multiple vacuum zones (z1-zN) of the vacuum chuck 100.

The vacuum chuck 100 of the embodiments of the present disclosure may be combined with vacuum control system configured to independently control the vacuum suction to each of the vacuum zones (z1-zN).

Figure 3A:
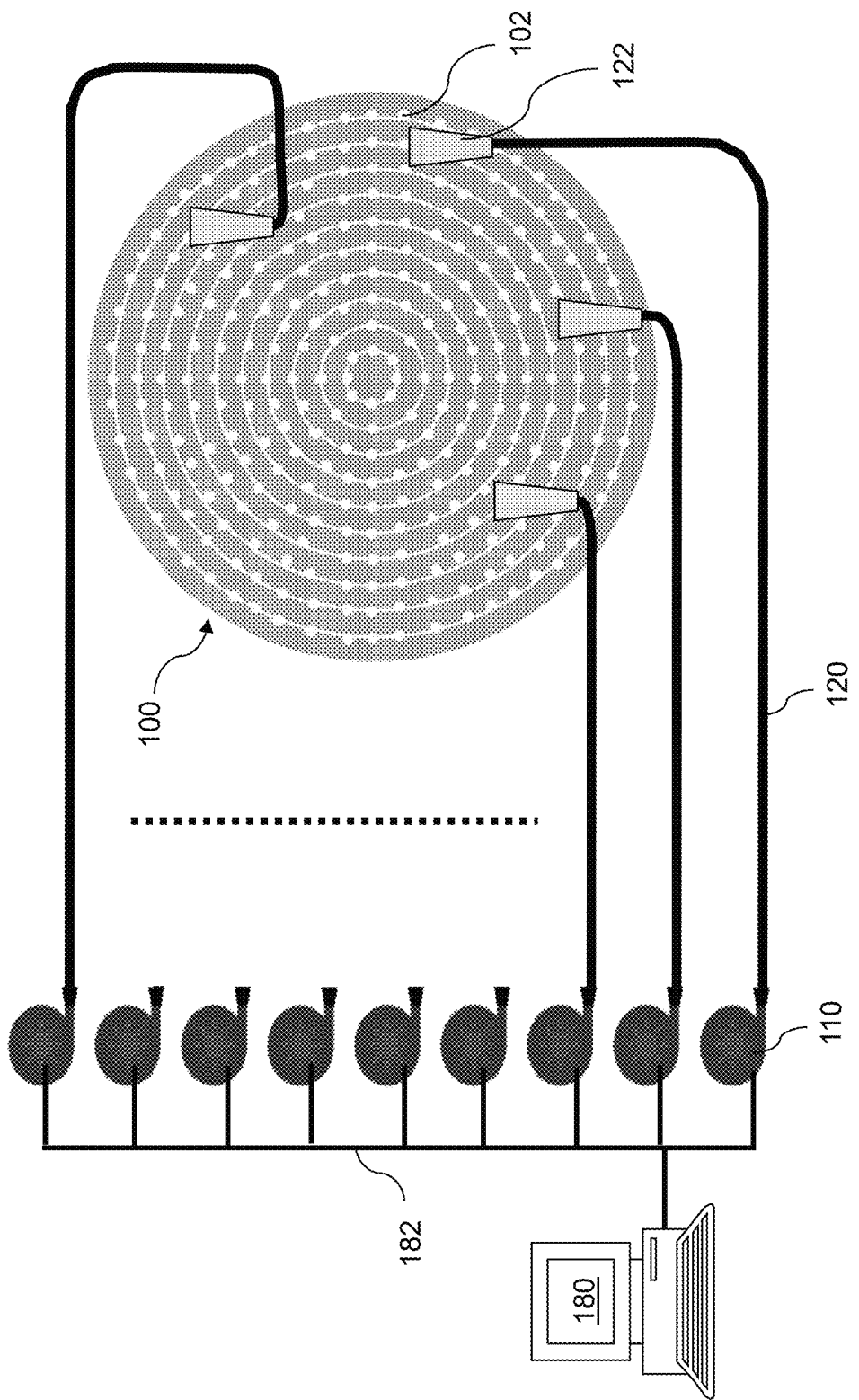
FIG. 3A is a schematic diagram of a first configuration of a vacuum chuck and a vacuum system of a wafer testing system according to an embodiment of the present disclosure.
Figure 3B:
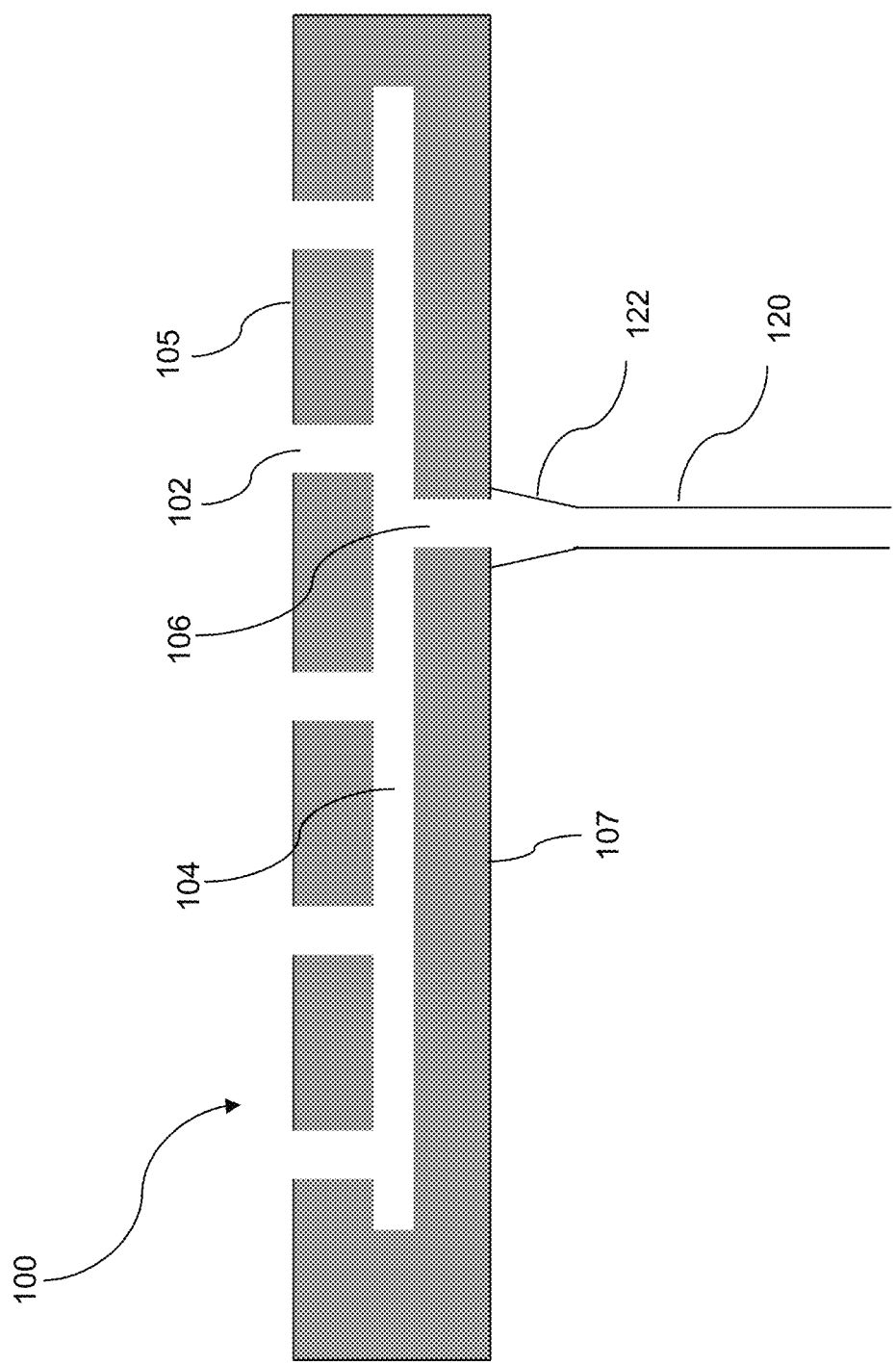
FIG. 3B is a vertical cross-sectional view of a vacuum zone of a vacuum chuck according to an embodiment of the present disclosure.

Referring to FIGS. 3A and 3B, a first configuration of a vacuum chuck 100 and a vacuum system for providing independently controlled vacuum suction to each of the multiple vacuum zones zi is illustrated. FIGS. 3A and 3B are schematic, and features that are repeated across different vacuum zones zi are illustrated only for some of the vacuum zones zi for clarity.

As shown in FIG. 3B, all vacuum suction ports 102 in vacuum zone zi of the multiple vacuum zones zi may be fluidly connected by a common, respective vacuum manifold 104 located below the front side (i.e., top) surface 105 of the vacuum chuck 100 which is configured to support the wafer under test. The vacuum manifold 104 can continuously extend to each of the vacuum suction ports 102 which comprise respective openings in the front side surface of the vacuum chuck 100. The vacuum manifold 104 can continuously extend to a backside opening 106 located in the backside surface 107 of the vacuum chuck 100. As shown in FIGS. 3A and 3B, independently controlled vacuum pumping lines 120 may be connected to a respective one of the vacuum manifolds 104 through a respective vacuum connection fitting 122 connected to the respective backside opening 106 of each vacuum manifold 104. Each vacuum connection fitting 122 can connect the backside opening 104 of a respective vacuum manifold 104 (located within a respective vacuum zone) to a respective independently controlled vacuum pumping line 120.

Generally, each of the multiple vacuum zones zi can include a respective vacuum manifold 104 that is embedded within the vacuum chuck 100, fluidly connects a respective set of vacuum suction ports 102 in parallel, and is connected to an end of a respective one of the independently controlled vacuum pumping lines 120, for example, through a backside opening 106 and a respective vacuum connection fitting 122.

Vacuum suction provided by the independently controlled vacuum pumping lines 120 may be independently controlled by vacuum control instrumentation. In one embodiment, the vacuum control instrumentation can include multiple vacuum pumps 110, a controller 180, such as a general purpose or special purpose computer or ASIC loaded with an computer program or code to provide control signals to each of the multiple vacuum pumps 110, and signal communication hardware 182 configured to provide communication between the controller 180 and each of the multiple vacuum pumps 110. The communication hardware 182 may comprise wired communication lines and/or wireless communication hardware. The automated program or code residing on the controller 180 is configured to generate independent control signals for each of the multiple vacuum pumps 110. The signal communication hardware 182 may be configured to transmit control signals from the controller 180 to each of the multiple vacuum pumps 110, and to optionally transmit feedback signals indicative of the operating state and performance from the multiple vacuum pumps 110 to the controller 180. In one embodiment, the pumping speed of each of the multiple vacuum pumps 110 may be independently controlled by the program or code located in the controller 180.

In one embodiment, each of the independently controlled vacuum pumping lines 120 is connected to a respective one of multiple vacuum pumps 110. The controller 180 and the signal communication hardware 182 constitutes vacuum control instrumentation for the set of the vacuum pumps 110. The vacuum control instrumentation is configured to individually control pumping speed of each of the multiple vacuum pumps 110, thereby providing independently controlled vacuum suction to each of the independently controlled vacuum pumping lines 120.

Figure 4:
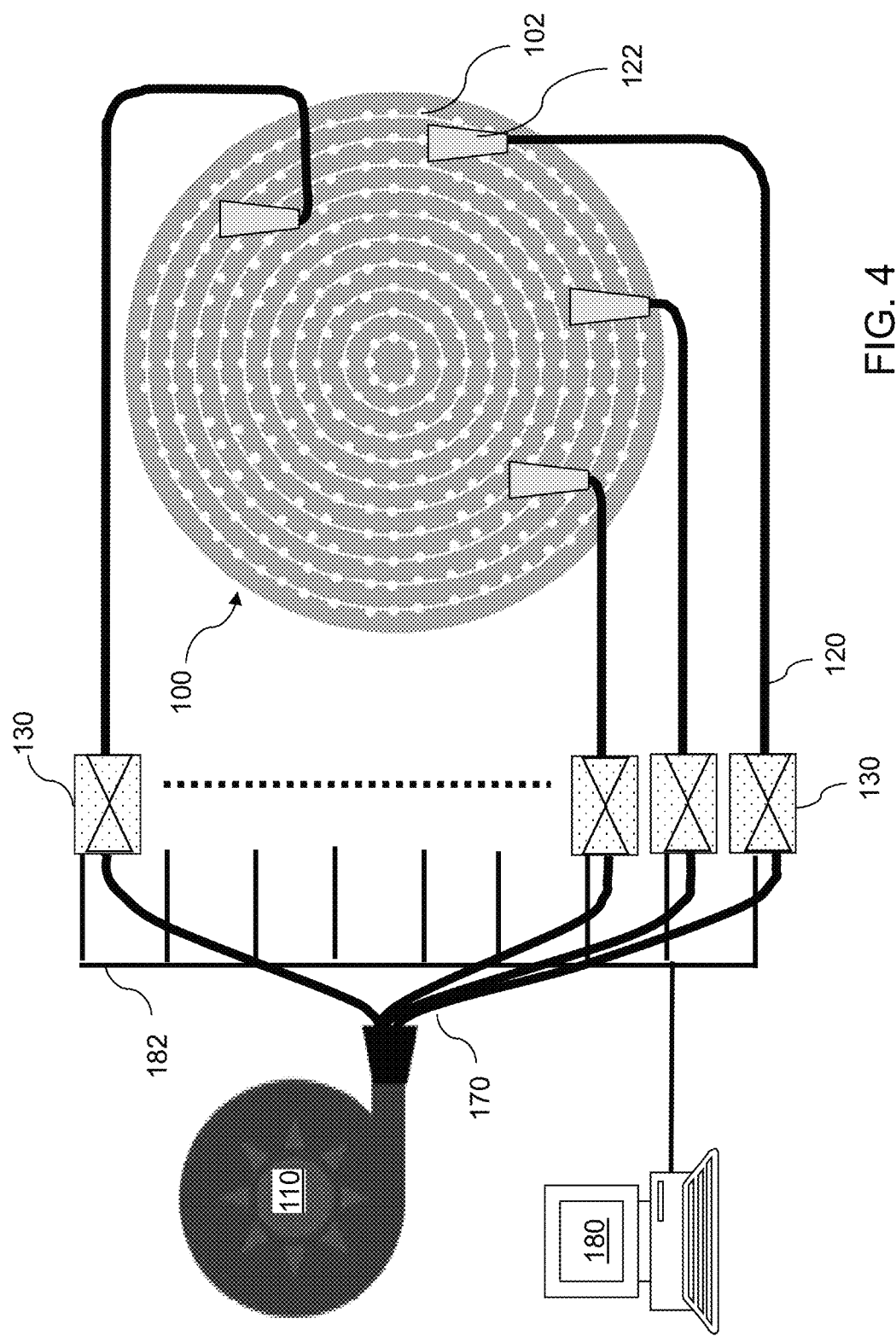
FIG. 4 is a schematic diagram of a second configuration of a vacuum chuck and a vacuum system of a wafer testing system according to an embodiment of the present disclosure.

Referring to FIG. 4, a second configuration of a vacuum chuck 100 and a vacuum system is illustrated. The second configuration may be derived from the first configuration illustrated in FIGS. 3A and 3B by replacing the multiple vacuum pumps 110 with a single vacuum pump 110 or a group of vacuum pumps 110 and a plurality of valves 130. Each vacuum pump or a group of vacuum pumps 110 may be connected to a respective plurality of valves 130. The valves 130 may be any computer controlled valves that may be used in a vacuum system, such as proportional valves. The single vacuum pump 110 or the group of vacuum pumps 110 can provide a predetermined magnitude of vacuum suction by operating at a predetermined pumping speed.

A group of independently controlled vacuum pumping lines 120 may be connected to a common vacuum pump 110 a respective set of valves 130. One valve 130 may be provided per independently controlled vacuum pumping line 120. The degree of vacuum suction provided to each of the independently controlled vacuum pumping lines 120 may be controlled by controlling the level (e.g., degree) of vacuum being drawn through a respective one of the valves 130.

The combination of the valves 130, the controller 180, and the signal communication hardware 182 collectively constitute vacuum control instrumentation, which is configured to individually control the magnitude of vacuum being drawn in each of the independently controlled vacuum pumping lines 120 by controlling a respective one of the valves 130.

Figure 5:
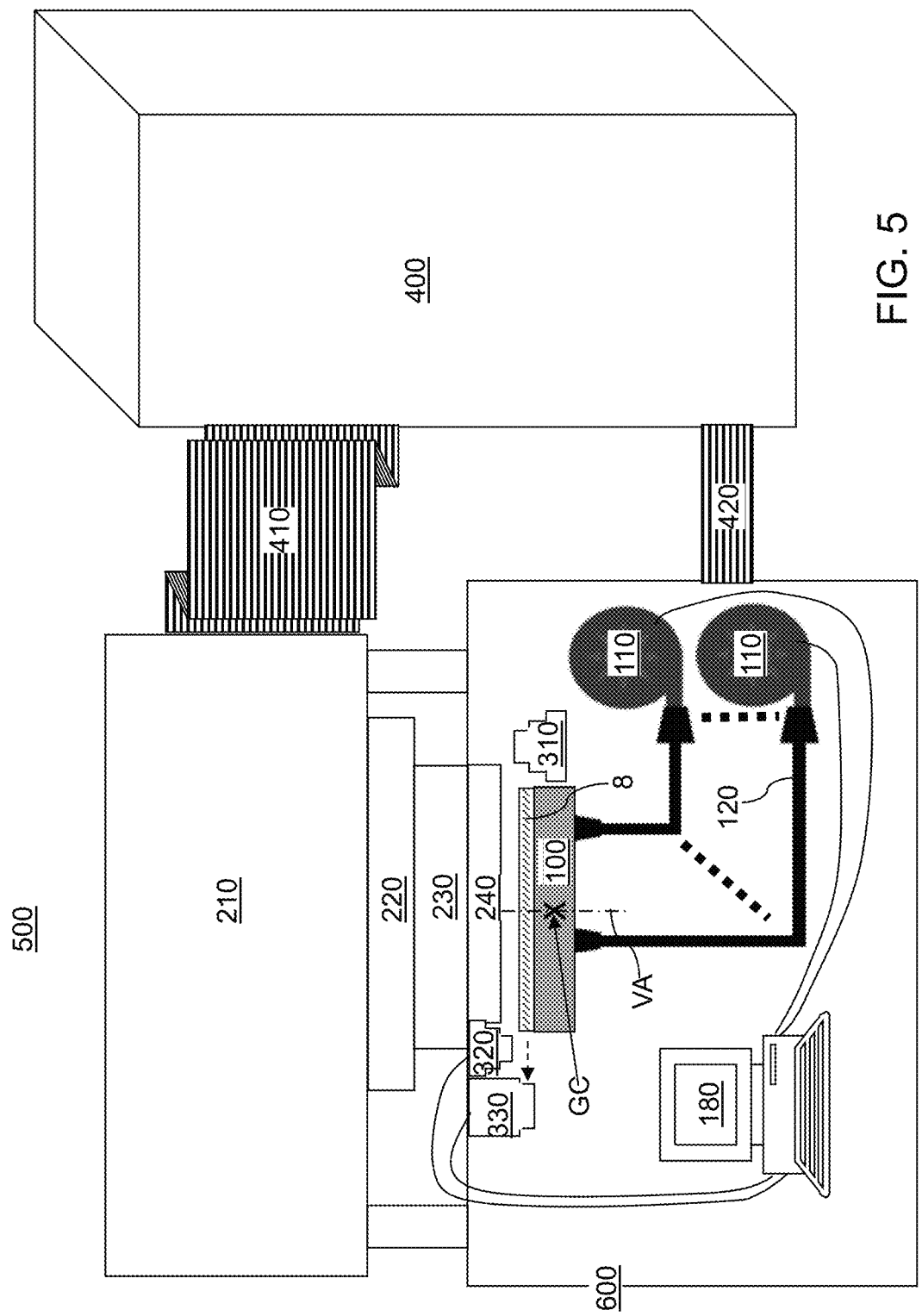
FIG. 5 is a schematic diagram of an exemplary wafer testing system according to an embodiment of the present disclosure.

The vacuum chuck 100, one or more vacuum pumps 110 and the vacuum control instrumentation of the embodiments of the present disclosure may be incorporated into a wafer testing system 500 shown in FIG. 5, in which wafer warpage of a wafer under testing may be reduced during testing. Reliability of test data may be enhanced by flattening the wafer under test. Specifically, the test pins of a prober card 240 can make more uniform physical and electrical contact with test pads on the wafer 8 under test because the warpage of the wafer under test may be reduced by applying different levels (i.e., degrees) of vacuum suction across the different regions of the backside of the wafer 8.

Referring to FIG. 5, an exemplary wafer testing system 500 according to an embodiment of the present disclosure incorporates the vacuum chuck 100 and the vacuum control instrumentation described above. Any of the configurations described above may be used for the vacuum control instrumentation of the wafer testing system 500 of the present disclosure.

The exemplary wafer testing system 500 can include a prober 600, a tester head 210 that overlies the prober 600, and a tester 400 connected to the prober 600 and the tester head 210 via a wired or wireless data connection. The prober 600 includes the vacuum chuck 100 configured to hold a wafer 8. The vacuum chuck 100 includes multiple vacuum zones zi as described above. Each of the multiple vacuum zones can include respective vacuum suction ports 102 that are connected to a respective one of independently controlled vacuum pumping lines 120. The prober 600 can include vacuum control instrumentation configured to individually control magnitude of vacuum suction for each of the independently controlled vacuum pumping lines 120.

The tester head 210 overlies the vacuum chuck 100 and is configured to hold a prober card 240 in a position that faces the wafer 8. A prober interface board 220 may be located on the tester head 210. The prober interface board 220 can provide electrical connection between the tester head 210 and the prober card 240. The prober card 240 may be configured to test semiconductor dies within the wafer 8. A pogo tower 230 may be provided between the prober card 240 and the prober interface board 220. The pogo tower 230 can include a plurality of signal transmission paths arranged as an annular array and a plurality of pogo pins (i.e., spring loaded connectors).

The tester 400 may be connected to the tester head 210 through signal cables 410 or wireless data connection. The tester 400 may be configured to provide test signals to the prober card 240, and may be configured to receive measurement signals from the prober card 240. The tester 400 can also be connected to the prober 600 through signal cables 420 or wireless data connection.

In one embodiment, at least one camera 310, such as a charge coupled device (CCD) camera may be provided in the proper 600 to monitor various components of the prober 600 during operation. An alignment camera 320 may be provided to enable lateral alignment of the wafer 8 to the vacuum chuck 100. In this case, the vertical axis VA passing through the geometrical center GC of the vacuum chuck 100 can pass through the geometrical center of the wafer 8. In one embodiment, the prober 600 may include a wafer warpage measurement sensor 330 configured to measure warpage of the wafer 8 upon placement of the wafer on the vacuum chuck 100. The wafer warpage measurement sensor 330 may be an optical sensor configured to measure warpage of the wafer 8, and to transmit measurement data on the warpage of the wafer to the controller 180.

Referring to all drawings and according to various embodiments of the present disclosure, the wafer warpage measurement sensor 330 and the vacuum chuck 100 may be configured to measure warpage of each portion of the wafer 8 that overlies a respective one of the vacuum zones zi. In one embodiment, two or more of the multiple vacuum zones zi are located at different azimuthal angle ranges around a vertical axis VA passing through a geometrical center GC of the vacuum chuck 100. The wafer warpage measurement sensor 330 may be configured to transmit to the vacuum control instrumentation the measurement data of the warpage of the wafer 8 for each portion of the wafer 8 that overlies a respective one of the multiple vacuum zones zi (e.g., $z_1$-$z_N$). For example, the wafer warpage measurement sensor 330 may be configured to provide a two-dimensional map of distances between the sensor 330 and various portions of the wafer within the field of view.

The initial three-dimensional warpage map of the wafer may be generated while each vacuum zone zi is provided with the same vacuum suction. Upon generation of a first three-dimensional warpage map of the wafer 8, non-uniform vacuum suction may be applied to the vacuum zones zi to reduce the warpage of the wafer 8, i.e., to flatten the wafer 8. Specifically, a greater vacuum suction is provided to each vacuum zone zi in which the average vertical distance between the wafer 8 and the vacuum chuck 100 is greater, and lesser vacuum suction is provided to each vacuum zone zi in which the average vertical distance between the wafer 8 and the vacuum chuck 100 is less or zero (i.e., the wafer 8 contacts the vacuum chuck 100). A second three-dimensional warpage map of the wafer 8 may be generated after application of the non-uniform vacuum suction to the multiple vacuum zones zi. Additional modification to the non-uniform vacuum suction may be made based on the second three-dimensional warpage map of the wafer 8 by individually adjusting the vacuum suction to each of the multiple vacuum zones zi. This process may be repeated as many times as necessary to reduce the warpage of the wafer 8 on the vacuum chuck 100 while the wafer 8 is loaded onto the vacuum chuck 100 for the purpose of testing.

Each set of processing steps that generates a three-dimensional warpage map and individual adjustment to the magnitude of vacuum suction for each vacuum zone zi constitutes one warpage adjustment cycle. A single warpage adjustment cycle may be employed to flatten the wafer 8, or a plurality of warpage adjustment cycles may be employed to flatten the wafer 8. The total number of warpage adjustment cycles may be in a range from 1 to 32, such as from 2-8, although a greater number of warpage adjustment cycles can also be employed.

Generally, the vacuum control instrumentation may be configured to provide a greater vacuum suction through an independently controlled vacuum pumping line 120 to a vacuum zone zi that underlies a portion of the wafer 8 having a greater wafer-to-chuck distance than through another independently controlled vacuum pumping line 120 to another vacuum zone zi that underlies a portion of the wafer 8 having a lesser wafer-to-chuck distance.

In one embodiment, each of the independently controlled vacuum pumping lines 120 may be connected to a respective one of multiple vacuum pumps 110, and the vacuum control instrumentation may be configured to individually control pumping speed of each of the multiple vacuum pumps 110.

In another embodiment, the independently controlled vacuum pumping lines 120 may be connected to a common vacuum pump 110 through a respective valve 130, and the vacuum control instrumentation may be configured to individually control the magnitude of vacuum in each of the independently controlled vacuum pumping lines 120 by controlling a respective one of the valves 130.

In one embodiment, the vacuum control instrumentation may be configured to provide greater vacuum suction to a region of the wafer 8 that overlies a vacuum zone zi at which the wafer 8 has a greater average vertical distance from a top surface of the vacuum chuck 100 than to another region of the wafer 8 that overlies another vacuum zone zi at which the wafer 8 has a lesser average vertical distance from the top surface of the vacuum chuck 100.

In one embodiment, the vacuum control instrumentation may be configured to apply uniform vacuum suction to the multiple vacuum zones zi upon placement of the wafer 8 to the vacuum chuck 100. The vacuum control instrumentation may be configured to run, or is configured to be controlled by, an automated program or code that generates a pattern of non-uniform vacuum suction across the multiple vacuum zones zi based on measurement of wafer warpage by the wafer warpage measurement sensor 330 such that warpage of the wafer 8 is reduced upon application of the pattern of non-uniform vacuum suction to the multiple vacuum zones zi.

In one embodiment, each of the multiple vacuum zones $z_i$ includes a respective vacuum manifold 104 that is located below the front surface 105 of the vacuum chuck 100, connects a respective set of vacuum suction ports 102, and is connected to an end of a respective one of the independently controlled vacuum pumping lines 120.

During operation of the wafer testing system 500 of the present disclosure, a wafer 8 may be loaded onto the vacuum chuck 100. Warpage of the wafer on the vacuum chuck 100 may be measured, for example, using the wafer warpage measurement sensor 330. Warpage of the wafer 8 may be reduced by providing non-uniform vacuum suction to the multiple vacuum zones $z_i$ by providing a different magnitude of vacuum suction to different independently controlled vacuum pumping lines 120. The wafer 8 may be tested after the step of providing the non-uniform vacuum suction. The testing may include electrical testing of the die 40 located on the wafer, and/or any other suitable testing, such as optical inspection for defects in the die 40, etc.

In one embodiment, warpage of the wafer 8 may be measured employing a wafer warpage measurement sensor 330 upon placement of the wafer 8 on the vacuum chuck 100. In one embodiment, the wafer warpage measurement sensor 330 and the vacuum chuck 100 may be configured to measure warpage of each portion of the wafer 8 that overlies a respective one of the vacuum zones $z_i$.

A greater vacuum suction may be provided to an independently controlled vacuum pumping line 120 that is fluidly connected to a vacuum suction port 102 that underlies a portion of the wafer 8 having a greater wafer-to-chuck distance than to another independently controlled vacuum pumping line 120 that is fluidly connected to another vacuum suction port 102 that underlies a portion of the wafer 8 having a lesser wafer-to-chuck distance based on the measurement data obtained by the wafer warpage measurement sensor 330 and processed by a data processing program or code located in the controller 180.

In case the independently controlled vacuum pumping lines 120 are connected to a common vacuum pump 110 through a respective valve 130, the magnitude of vacuum in each of the independently controlled vacuum pumping lines 120 may be independently controlled by controlling a respective one of the valves 130.

In case the independently controlled vacuum pumping lines 120 are connected to a respective one of multiple vacuum pumps 110, pumping speed of each of the multiple vacuum pumps 110 may be individually controlled by an automated program or code located in the controller 180 that generates control signals derived from the warpage measurement data of the wafer 8.

In one embodiment, greater vacuum suction is provided to a region of the wafer 8 that overlies a vacuum zone $z_i$ at which the wafer 8 has a greater average vertical distance from a top surface of the vacuum chuck 100 than to another region of the wafer 8 that overlies another vacuum zone $z_i$ at which the wafer 8 has a lesser average vertical distance from the top surface of the vacuum chuck 100.

The various embodiments of the present disclosure may be employed to temporarily flatten a wafer 8 under test while the wafer 8 is located on a chuck of a wafer testing system. The wafer 8 is flattened by providing different magnitude of vacuum suction to different vacuum zones $z_i$ of the vacuum chuck 100 based on the warpage measurement data from the wafer 8. Probe pins of the prober card 240 can make more uniform physical and electrical contact with test pads on the wafer 8 under test, thereby enhancing the reliability of the test data and enabling testing of a higher percentage of die 40 on the wafer 8. The non-uniform vacuum suction does not introduce any permanent deformation in the wafer 8, and the compensatory distortion of the wafer 8 that reduces warpage of the wafer 8 is removed upon release of vacuum suction and removal of the wafer 8 from the vacuum chuck 100.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. An apparatus, comprising:
    a vacuum chuck configured to hold a wafer, wherein the vacuum chuck comprises a plurality of vacuum zones, each vacuum zone including respective vacuum suction ports; and
    vacuum control instrumentation configured to individually control a magnitude of vacuum suction for each of the vacuum zones to provide a different magnitude of vacuum suction to different vacuum zones at the same time based on warpage of the wafer,
    wherein the vacuum zones comprise a set of N vacuum zones located at different azimuthal angle ranges around a vertical axis passing through a geometrical center of the vacuum chuck, each vacuum zone within the set of N vacuum zones being located within a respective unique azimuthal angle range that does not overlap with azimuthal angle ranges of other vacuum zones within the set of N vacuum zones, N being an integer in a range from 2 to 200; and
    wherein each vacuum zone within the set of N vacuum zone comprises a respective vacuum manifold, the respective vacuum manifold comprising:
        a laterally-extending portion that laterally extends within the vacuum chuck between a top surface of the vacuum chuck and a backside surface of the vacuum chuck and vertically spaced from the top surface of the vacuum chuck and the backside surface of the vacuum chuck, and
        a plurality of vacuum suction ports vertically extending from the top surface of the vacuum chuck to the laterally-extending portion and located at different azimuthal angles around the geometrical center of the vacuum chuck.

2. The apparatus of claim 1, further comprising a wafer warpage measurement sensor configured to measure the warpage of the wafer after placement of the wafer on the vacuum chuck, wherein the wafer warpage measurement sensor is configured to measure the warpage of each portion of the wafer that overlies a respective one of the vacuum zones.

3. The apparatus of claim 2, wherein the vacuum suction ports in each vacuum zone are connected to a respective one of independently controlled vacuum pumping lines.

4. The apparatus of claim 3, wherein the wafer warpage measurement sensor is configured to transmit measurement data corresponding to the warpage of the wafer to the vacuum control instrumentation for each portion of the wafer that overlies a respective one of the vacuum zones.

5. The apparatus of claim 4, wherein the vacuum control instrumentation is configured to provide a greater vacuum suction through a first independently controlled vacuum pumping line to a first vacuum zone that underlies a first portion of the wafer having a greater wafer-to-chuck distance than through a second independently controlled vacuum pumping line to a second vacuum zone that underlies a second portion of the wafer having a lesser wafer-to-chuck distance.

6. The apparatus of claim 4, wherein:
the independently controlled vacuum pumping lines are connected to a respective one of multiple vacuum pumps; and
the vacuum control instrumentation is configured to individually control a pumping speed of each of the multiple vacuum pumps to individually control the magnitude of vacuum suction for each of the vacuum zones.

7. The apparatus of claim 4, wherein:
the independently controlled vacuum pumping lines are connected to a common vacuum pump through a respective valve; and
the vacuum control instrumentation is configured to individually control the magnitude of vacuum suction to each of the independently controlled vacuum pumping lines by controlling a respective one of the valves.

8. The apparatus of claim 3, wherein the vacuum control instrumentation is configured to provide greater vacuum suction to a region of the wafer that overlies a vacuum zone at which the wafer has a greater average vertical distance from a front surface of the vacuum chuck than to another region of the wafer that overlies another vacuum zone at which the wafer has a lesser average vertical distance from the front surface of the vacuum chuck.

9. The apparatus of claim 3, wherein:
the vacuum control instrumentation is configured to apply a uniform vacuum suction to all the vacuum zones upon placement of the wafer to the vacuum chuck; and
the vacuum control instrumentation is configured to generate a pattern of non-uniform magnitude of vacuum suction across the vacuum zones based on measurement of wafer warpage by the wafer warpage measurement sensor, such that the warpage of the wafer is reduced upon application of the pattern of the non-uniform magnitude of vacuum suction to the vacuum zones.

10. The apparatus of claim 3, wherein each of the vacuum zones includes a respective vacuum manifold that located below a top surface of the vacuum chuck, connects a respective set of vacuum suction ports, and is connected to an end of a respective one of the independently controlled vacuum pumping lines.

11. The apparatus of claim 1, further comprising:
a tester head overlying the vacuum chuck and configured to hold a prober card in a position that faces the wafer;
a tester configured to provide test signals to the prober card and to receive measurement signals from the prober card; and
a prober interface board providing electrical connection between the tester head and the prober card, wherein the prober card is configured to electrically test semiconductor dies on the wafer.

12. A method of testing a wafer, comprising:
placing a wafer on a vacuum chuck containing a plurality of vacuum zones, wherein the plurality of vacuum zones comprises a set of N vacuum zones located at different azimuthal angle ranges around a vertical axis passing through a geometrical center of the vacuum chuck, each vacuum zone within the set of N vacuum zones being located within a respective unique azimuthal angle range that does not overlap with azimuthal angle ranges of other vacuum zones within the set of N vacuum zones, N being an integer in a range from 2 to 200; and
wherein each vacuum zone within the set of N vacuum zone comprises a respective vacuum manifold, the respective vacuum manifold comprising:
a laterally-extending portion that laterally extends within the vacuum chuck between a top surface of the vacuum chuck and a backside surface of the vacuum chuck and vertically spaced from the top surface of the vacuum chuck and the backside surface of the vacuum chuck; and
a plurality of vacuum suction ports vertically extending from the top surface of the vacuum chuck to the laterally-extending portion and located at different azimuthal angles around the geometrical center of the vacuum chuck;
determining a warpage of the wafer;
providing a different magnitude of vacuum suction to different vacuum zones at the same time based on the determined warpage of the wafer to reduce the warpage of the wafer; and
testing the wafer.

13. The method of claim 12, wherein determining the warpage of the wafer comprises measuring the warpage of the wafer using a wafer warpage measurement sensor after placing the wafer on the vacuum chuck.

14. The method of claim 13, wherein the wafer warpage measurement sensor measures the warpage of each portion of the wafer that overlies a respective one of the vacuum zones.

15. The method of claim 13, further comprising providing a greater vacuum suction through a first independently controlled vacuum pumping line to a first vacuum zone that underlies a first portion of the wafer having a greater wafer-to-chuck distance than through a second independently controlled vacuum pumping line to a second vacuum zone that underlies a second portion of the wafer having a lesser wafer-to-chuck distance.

16. The method of claim 15, wherein:
the first and the second independently controlled vacuum pumping lines are connected to respective first and second vacuum pumps; and
the method further comprises individually controlling the magnitude of vacuum suction to each of the first and the second independently controlled vacuum pumping lines by individually controlling a pumping speed of each of the first and second vacuum pumps.

17. The method of claim 15, wherein:
the first and the second independently controlled vacuum pumping lines are connected to a common vacuum pump through respective first and second valves; and
the method further comprises individually controlling the magnitude of vacuum suction to each of the first and the second independently controlled vacuum pumping lines by controlling the first and the second valves.

18. The method of claim 12, wherein the wafer comprises a semiconductor wafer containing a plurality of three-dimensional NAND memory devices comprising:
- an alternating stack of word lines and insulating layers; and
- a plurality of memory stack structures which extend through the alternating stack, each memory stack structure comprising a semiconductor channel and a memory film.

* * * * *